United States Patent
Liu et al.

(10) Patent No.: US 8,367,768 B2
(45) Date of Patent: Feb. 5, 2013

(54) ENCAPSULANT COMPOSITIONS AND METHOD FOR FABRICATING ENCAPSULANT MATERIALS

(75) Inventors: Lung-Chang Liu, XinZhuang (TW); Ming-Hua Chung, Tainan (TW); Tsung-Ju Hsu, Fengyuan (TW); Chih-Fen Chang, Hsinchu (TW); Jen-Hao Chen, Hsinchu (TW)

(73) Assignee: Industrial Technology Research Institute, Hsinchu County (TW)

( * ) Notice: Subject to any disclaimer, the term of this patent is extended or adjusted under 35 U.S.C. 154(b) by 185 days.

(21) Appl. No.: 12/639,467

(22) Filed: Dec. 16, 2009

(65) Prior Publication Data

US 2010/0148666 A1 Jun. 17, 2010

(30) Foreign Application Priority Data

Dec. 16, 2008 (GB) .................................. 0822911.4

(51) Int. Cl.
*C08F 2/46* (2006.01)
*B29B 13/08* (2006.01)
*B05D 5/00* (2006.01)

(52) U.S. Cl. ......... 524/858; 524/779; 524/787; 427/457

(58) Field of Classification Search ...................... 528/10
See application file for complete search history.

(56) References Cited

U.S. PATENT DOCUMENTS

| | | | |
|---|---|---|---|
| 4,371,664 A * | 2/1983 | Kato et al. ..................... 525/100 |
| 4,617,327 A * | 10/1986 | Podszun ....................... 523/116 |
| 5,672,393 A | 9/1997 | Bachmann et al. |
| 6,099,783 A | 8/2000 | Scranton et al. |
| 6,129,955 A | 10/2000 | Papathomas et al. |
| 6,207,728 B1 * | 3/2001 | Sekiguchi et al. ............... 522/83 |
| 6,368,994 B1 * | 4/2002 | Sklyarevich ....................... 502/5 |
| 6,426,373 B1 * | 7/2002 | Stange et al. .................. 523/116 |
| 6,517,941 B1 * | 2/2003 | Murase .......................... 428/412 |
| 6,592,969 B1 * | 7/2003 | Burroughes et al. ........ 428/195.1 |
| 6,605,128 B2 * | 8/2003 | Larson et al. .................... 51/298 |
| 6,605,651 B1 * | 8/2003 | Stangel et al. ................. 523/116 |
| 6,610,219 B2 * | 8/2003 | McGinniss et al. ........... 252/582 |

(Continued)

FOREIGN PATENT DOCUMENTS

| | | |
|---|---|---|
| CN | 1607218 A | 4/2005 |
| EP | 0969058 A2 | 1/2000 |

(Continued)

OTHER PUBLICATIONS

Martin Price, Examination Report issued by the United Kingdom's Intellectual Property Office on Dec. 7, 2010, for the counterpart application in the United Kingdom (Appl. No: GB0822911.4).

(Continued)

*Primary Examiner* — Robert S Loewe
(74) *Attorney, Agent, or Firm* — Pai Patent & Trademark Law Firm; Chao-Chang David Pai

(57) ABSTRACT

An encapsulant composition is provided. The encapsulant composition includes at least one silane-containing monomer and at least one resin monomer selected from the group consisting of acrylic resin monomers and epoxy resin monomers, a filler of about 0.1-15 wt % of the encapsulant composition, and an initiator. The invention also provides a method for fabricating an encapsulant material.

16 Claims, 2 Drawing Sheets

U.S. PATENT DOCUMENTS

| | | |
|---|---|---|
| 6,660,394 B1 * | 12/2003 | Ishizuki et al. ............... 428/447 |
| 6,692,986 B1 * | 2/2004 | Bayer et al. ...................... 438/99 |
| 6,703,433 B1 * | 3/2004 | Bahadur et al. ................. 522/99 |
| 6,790,126 B2 * | 9/2004 | Wood et al. ...................... 451/41 |
| 7,569,619 B2 * | 8/2009 | Esaki et al. ..................... 522/79 |
| 8,079,703 B2 * | 12/2011 | Chang et al. ............. 351/159.33 |
| 2002/0066233 A1 * | 6/2002 | McArdle et al. ................ 51/308 |
| 2003/0114556 A1 | 6/2003 | Jennrich et al. |
| 2004/0026833 A1 * | 2/2004 | Culler et al. ................... 264/461 |
| 2004/0225025 A1 * | 11/2004 | Sullivan et al. ................. 522/71 |
| 2005/0023665 A1 | 2/2005 | Ledwidge |
| 2005/0158480 A1 | 7/2005 | Goodwin et al. |
| 2006/0135705 A1 | 6/2006 | Vallance et al. |
| 2006/0158111 A1 * | 7/2006 | Hayashi ........................ 313/512 |
| 2006/0223978 A1 | 10/2006 | Kong |
| 2007/0049655 A1 * | 3/2007 | Yoshimune et al. .......... 522/178 |
| 2007/0117902 A1 * | 5/2007 | Origuchi et al. .............. 524/457 |
| 2007/0122733 A1 * | 5/2007 | Hattori et al. ................. 430/141 |
| 2007/0179249 A1 * | 8/2007 | Okada et al. .................. 525/244 |
| 2007/0295386 A1 * | 12/2007 | Capps et al. .................. 136/251 |
| 2008/0027154 A1 * | 1/2008 | Ramsey ............................ 522/7 |
| 2008/0102262 A1 * | 5/2008 | Esaki et al. ................... 428/220 |
| 2009/0253232 A1 * | 10/2009 | Thomson et al. ............. 438/118 |
| 2009/0270526 A1 * | 10/2009 | Liu et al. ......................... 522/66 |
| 2010/0316828 A1 * | 12/2010 | Baikerikar et al. ............. 428/38 |

FOREIGN PATENT DOCUMENTS

| | | |
|---|---|---|
| EP | 1502922 A1 | 2/2005 |
| EP | 1911579 A1 | 4/2008 |
| JP | 2000061974 A | 2/2000 |
| JP | 2007-324358 A | 12/2007 |
| TW | 200736327 A | 10/2007 |
| WO | 2007120197 A2 | 10/2007 |

OTHER PUBLICATIONS

Notification of first examination opinion issued by the China Intellectual Property Office on Aug. 1, 2011, for the above-referenced application's counterpart application in China (Application No. 200910206444.X).

Notification of examination opinion issued by the Taiwan Intellectual Property Office on Oct. 25, 2012, for the above-referenced application's counterpart application in Taiwan (Application No. 98133548).

\* cited by examiner

ENCAPSULANT COMPOSITIONS AND METHOD FOR FABRICATING ENCAPSULANT MATERIALS

CROSS REFERENCE TO RELATED APPLICATIONS

This application claims priority of U.K. Patent Application No. 0822911.4, filed on Dec. 16, 2008, the entirety of which is incorporated by reference herein.

BACKGROUND OF THE INVENTION

1. Field of the Invention

The invention relates to an encapsulant composition, and more particularly to an encapsulant composition used for fabricating an encapsulant material with high light transmittance and a method for fabricating the encapsulant material which is suitable for use in packaging solid state light-emitting devices to improve light transmittance thereof.

2. Description of the Related Art

With development of the optical-electronic industry, optical-electronic devices, for example, organic light emitting diodes (OLED), light emitting diodes (LED) and solar cells have been developed. Optical-electronic elements in an optical-electronic device, however, are easily damaged by moisture and oxygen, resulting in a short operating lifespan. Therefore, using suitable materials to package optical-electronic devices are necessary to prevent such optical-electronic elements from moisture and oxygen, increasing operating lifespan.

Conventional encapsulant materials are synthesized by thermal processes. A resin monomer is first synthesized to form a resin, and fillers and hardeners are then added and mixed therewith to obtain an encapsulant material. However, the above thermal processes are time-consuming, normally taking a couple of hours or up to ten hours or more to complete resin synthesis. In addition, since the above thermal processes incorporate solvents, reaction conditions and process safety issues are a concern. Therefore, fabrication time and costs for fabricating encapsulant materials by the thermal processes are not easily reduced.

Thus, a novel method for fabricating encapsulant materials and encapsulant compositions for forming thereof are needed to fabricate encapsulant materials in a faster and safer method, decreasing fabrication time and costs, and improving safety issues during fabrication.

BRIEF SUMMARY OF THE INVENTION

Accordingly, encapsulant compositions and methods for fabricating encapsulant materials having lower production costs, decreased fabrication safety issues and faster fabrication processes are provided.

An exemplary encapsulant composition comprises at least one silane-containing monomer and at least one resin monomer selected from the group consisting of acrylic resin monomers and epoxy resin monomers; a filler of 0.1-15 wt % of the encapsulant composition; and an initiator.

An exemplary method for fabricating encapsulant materials comprises providing an encapsulant composition comprising at least one silane-containing monomer and at least one resin monomer selected from the group consisting of acrylic resin monomers and epoxy resin monomers, a filler and an initiator, wherein the filler is 0.1-15 wt % of the encapsulant composition; and performing a heating process by a microwave source to polymerize the encapsulant composition.

In conventional heating processes, heat energy is transmitted by conduction and convection, for example, a solution in a container is heated by conduction of the heated container. In a microwave heating process, however, heat energy is transmitted by irradiation, for example, a reactant is directly heated by microwave irradiation, with an improved heating efficiency.

Compared to conventional heating processes, the microwave heating process reduces loss of heat energy and increases reaction rate (effective collision probability) by molecule dipole moment rotation under a variation of microwave field. Additionally, using organic solvent is not required therein.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
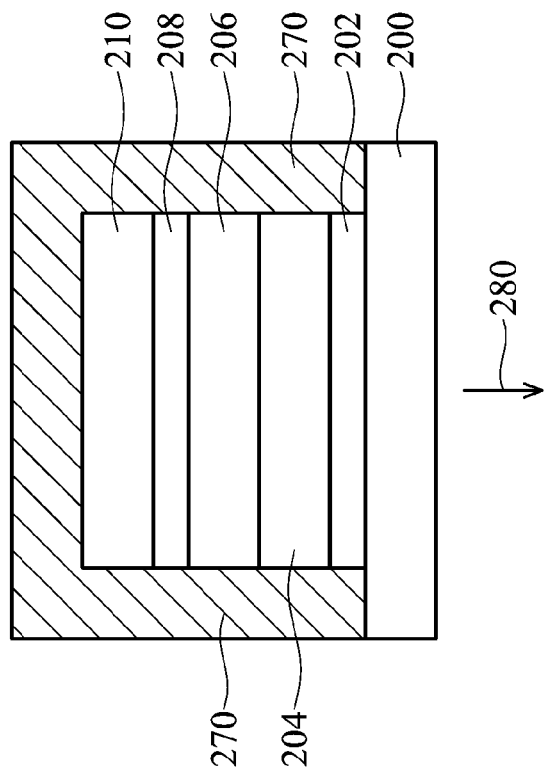
FIG. 1 is a schematic diagram showing an organic light emitting diode according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The encapsulant composition and the method for fabricating encapsulant materials of the invention have the advantages of having lower production costs, improved fabrication safety issues, and much faster fabrication processes than that provided by the prior art using thermal processes. The encapsulant materials of the invention also show high moisture resistance and gas blocking ability, thereby making them appropriate for application when packaging light emitting devices, such as light emitting diodes (LED).

In an embodiment, an encapsulant composition mainly comprises a resin monomer comprising at least one silane-containing monomer and at least one acrylic or epoxy resin monomer, a filler and an initiator. Ratios of such materials in the encapsulant composition may be adjusted to form transparent packaging materials having high light transparency. In the encapsulant composition, the resin component is about 100 parts by weight, and the filler and the initiator respectively is about 0.1-15 parts by weight and 0.1-1 part by weight based on the 100 parts by weight of the resin component. The filler is about 0.1-15 wt % of the encapsulant composition, preferably about 5-15 wt %.

In one embodiment, the encapsulant composition comprises a silane-containing monomer and at least one resin monomer such as an acrylic resin monomer, an epoxy resin monomer, and compositions thereof.

In another embodiment, an acrylic resin monomer may be present having a structure represented by a formula of:

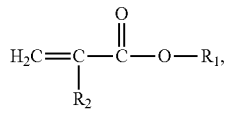

wherein each of $R_1$ and $R_2$ is an alkyl group having 1 to 12 carbon atoms, a tert-butyl group, an ester group having 1 to 12 carbon atoms, an alkanol group having 1 to 12 carbon atoms or a cyclo-alkoxy group having 1 to 12 carbon atoms.

In one embodiment, an epoxy resin monomer may be present having a structure represented by a formula of:

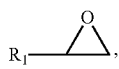

wherein $R_1$ is an alkyl group having 1 to 12 carbon atoms, a tert-butyl group, an ester group having 1 to 12 carbon atoms, an alkanol group having 1 to 12 carbon atoms or a cyclo-alkoxy group having 1 to 12 carbon atoms.

In one embodiment, the silane-containing monomer may comprise a structure represented by a formula of:

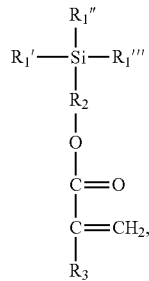

wherein $R_1'$, $R_1''$ and $R_1'''$ are the same or different, and each of $R_1'$, $R_1''$, $R_1'''$, $R_2$ and $R_3$ is an alkyl group having 1 to 12 carbon atoms, a tert-butyl group, an ester group having 1 to 12 carbon atoms, an alkanol group having 1 to 12 carbon atoms or a cyclo-alkoxy group having 1 to 12 carbon atoms.

In one embodiment, the filler may comprise metal oxide such as silicon oxide or silicon aluminum, metal halides such as zinc chloride, metal nitride such as aluminum nitride or other powders such as calcium carbonate.

In one embodiment, the initiator may comprise peroxides such as benzoyl peroxide, azo compounds such as azobisisobutyronitrile (AIBN), free radical initiators such as 1-hydroxy-cyclohexyl-phenyl-ketone, cationic initiators such as iodonium 4-methylphenyl and 4-(2-methylpropyl)phenyl]-hexafluorophosphate, or metallocene complexes such as bis (eta 5-2,4-cyclopentadien-1-yl)bis[2,6-difluoro-3-(1H-pyrrol-1-yl)phenyl]titanium.

In one embodiment, the encapsulant composition mainly comprises a plurality of acrylic monomers such as benzyl methacrylate (BZMA), methyl methacrylate (MAA), and 2-hydroxyl ethyl mathacrylate (2-HEMA), a filler such as silicon dioxide, and an initiator such as AIBN, thereby forming an acrylic copolymer. In this embodiment, the acrylic monomer is about 89 parts by weight, and the filler and the initiator respectively is 8-10 parts by weight and 1-3 parts by weight based on the 100 parts by weight of the acrylic monomer. The filler is about 1-40 wt % of the encapsulant composition, preferably about 10-20 wt %.

In another embodiment, the encapsulant composition mainly comprises a polyurethane (PU)-acrylics comonomer, a filler such as silicon dioxide, and an initiator such as azobisisobutyronitrile, thereby forming a PU-acrylics copolymer. In the encapsulant composition of this embodiment, the PU-acrylics comonomer is about 72 parts by weight, and the filler and the initiator respectively is 20-25 parts by weight and 2-5 parts by weight based on the 100 parts by weight of the PU-acrylics comonomer. The filler is about 1-40 wt % of the encapsulant composition, preferably about 10-20 wt %.

In yet another embodiment, the encapsulant composition mainly comprises a silicone-acrylics comonomer, a filler such as silicon dioxide, and an initiator such as AIBN, thereby forming a silicone-acrylics copolymer. In the encapsulant composition of this embodiment, the silicone-acrylics monomer is about 71 parts by weight, and the filler and the initiator respectively is about 20-25 parts by weight and 2-5parts by weight based on the 100 parts by weight of the silicone-acrylics comonomer. The filler is about 1-40 wt % of the encapsulant composition, preferably about 10-20 wt %.

In another embodiment, the encapsulant composition mainly comprises an epoxy monomer, a filler such as silicon dioxide, and an initiator such as 2-ethyl-4-methyl imidazole (EMID), thereby forming an epoxy polymer. In the encapsulant composition of this embodiment, the epoxy monomer is about 90 parts by weight, and the filler and the initiator respectively is 5-9 parts by weight and 1-5 parts by weight based on the 100 parts by weight of the epoxy monomer. The filler is about 1-30 wt % of the encapsulant composition, preferably about 5-15 wt %.

The encapsulant composition is polymerized with heating by a microwave source to form an encapsulant material. Heating time and power of the microwave source may be properly adjusted to prepare the encapsulant material with a viscosity of about 1-100,000 cps, preferably between 5,000-30,000 cps, and a light transparency exceeding 85%, suitable for use in packaging light emitting devices, such as organic light emitting diodes, light emitting diodes or solar cells.

The encapsulant composition of the invention provides the following advantages:

1. Light transparency of the encapsulant material is adjusted by adjusting content of the filler, thereby providing a transparent encapsulant material having a light transparency exceeding 85%, and sometimes even more than 90%.

2. The encapsulant material of the invention has a great adhesive strength of up to 2.1 kg/cm.

3. The encapsulant material of the invention shows better gas and moisture proof abilities than that of the encapsulant material of the prior art using thermal processes, improving device lifespan.

4. The encapsulant material of the invention can be applied in packaging optical-electronic devices such as light emitting diodes, organic light emitting diodes and solar cells and is an appropriate packaging industry material.

Moreover, in an embodiment, a method for fabricating an encapsulant material comprising providing the disclosed encapsulant composition and performing a heating process by a microwave source to polymerize the encapsulant composition is provided. The heating process is performed for about 1 to 200 minutes and may be performed under a power of about 1 to 20,000 watts.

In addition, since the encapsulant material may still have some flow properties after the heating process, the encapsulant material may be formed over an optical-electronic device by, for example, spin-coating, acting as a final packaging layer. In an embodiment, the method for fabricating the encapsulant material may further comprise an illumination process performed by a light source to solidify the encapsulant composition. The illumination process is performed for a time of about 1 to 200 minutes and under a power of about 1 to 20,000 watts.

The light source used in the illumination processes may be, for example an ultraviolet (UV) light source, a visible light source or an infrared (IR) light source and may be decided according to the type of the initiator used therein.

The method for fabricating encapsulant materials of the invention provides the following advantages:

1. There is no requirement to control reaction pressure and temperature during fabrication of the encapsulant material of the invention as all that is required is steady stirring thereof. Thus, fabricating method for forming the encapsulant material of the invention is simplified.

2. No solvent is required for forming the encapsulant material of the invention, thus improving fabrication safety.

3. The encapsulant material of the invention is synthesized during fabrication thereof and thus fabrication time and costs are reduced.

4. The filler in the encapsulant material of the invention shows great disparity and the moisture and gas proof ability thereof is improved, thereby improving operating lifespan of packaged devices using the encapsulant material of the invention.

5. Light transparency of the encapsulant material is adjusted by adjusting contents of the filler, thereby providing a transparent encapsulant material having a light transparency exceeding 90%.

6. The method for fabricating the encapsulant material of the invention is applied in packaging optical-electronic devices such as light emitting diodes, organic light emitting diodes and solar cells and is an appropriate packaging industry material.

In conventional heating processes, heat energy is transmitted by conduction and convection, for example, a solution in a container is heated by conduction of the heated container. In a microwave heating process, however, heat energy is transmitted by irradiation, for example, a reactant is directly heated by microwave irradiation, with an improved heating efficiency.

Compared to conventional heating processes, the microwave heating process reduces loss of heat energy and increases reaction rate (effective collision probability) by molecule dipole moment rotation under a variation of microwave field. Additionally, using organic solvent is not required therein.

The encapsulant composition, the method for fabricating the encapsulant materials, and the related measurement results of the examples and comparative examples are described in detail as below. Chemical vendors and formulas of the chemicals used in the following examples and comparative examples are provided in the following tables, wherein Table 1 shows information of resin monomers applied therein, Table 2 shows information of the initiators applied therein and Table 3 shows information of the optical-electronic materials applied therein.

TABLE 1

Applied resin monomers

| Monomer | Source vendor | Descriptions/Remarks |
|---|---|---|
| BZMA | UCB Co. | Liquefied monomer; formula: $C_{11}H_{12}O_2$; molecular weight: 176 |
| MAA | UCB Co. | Liquefied monomer; formula: $C_4H_6O_2$; molecular weight: 86 |
| 2-HEMA | UCB Co. | Liquefied monomer; formula: $C_6H_{10}O_3$; molecular weight: 130 |
| PU/Acrylics comonomer a | UCB Co. | Liquefied monomer; formula: $C_{15}H_{12}O_4NCl$; molecular weight: 305.5 |
| PU/Acrylics comonomer b | UCB Co. | Liquefied monomer; formula: $C_{25}H_{30}O_8N_2$; molecular weight: 486 |
| PU/Acrylics comonomer c | UCB Co. | Liquefied monomer; formula: $C_{28}H_{46}O_8N_2$; molecular weight: 553 |
| Silicone monomer a | Aldrich Co. | Liquefied monomer; formula: $C_{10}H_{17}O_5Si$; molecular weight: 245 |
| Epoxy monomer a | UCB Co. | Liquefied monomer; formula: $C_{21}H_{24}O_4$; molecular weight: 340 |

The above monomers and comonomers have structures represented as follows:

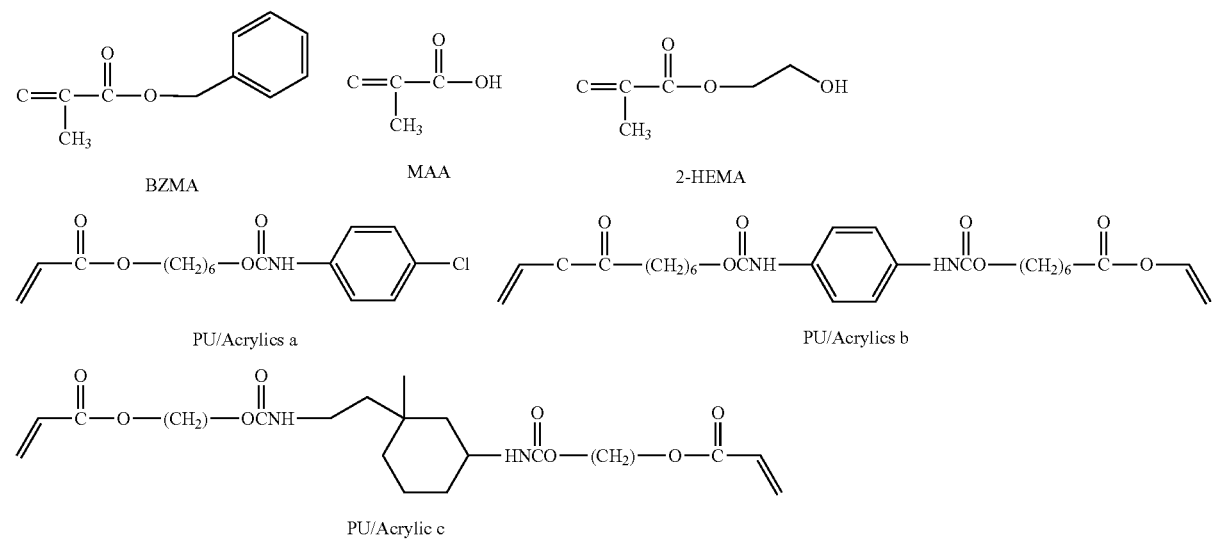

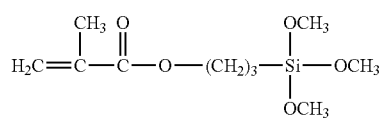

Silicone a

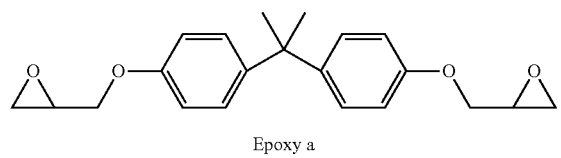

Epoxy a

TABLE 2

Applied initiators

| Initiator | Source vendor | Descriptions/Remarks |
|---|---|---|
| I-184 (1-hydroxy-cyclohexyl benzophenone) | Ciba Co. | Suitable for deep UV light source (wavelength between 190 nm-350 nm) |
| I-396 | Ciba Co. | Suitable for deep UV light source |
| I-ITX | Ciba Co. | Suitable for deep UV light source |
| I-127 | Ciba Co. | Suitable for deep UV light source |
| I-250 | Ciba Co. | Suitable for deep UV light source |
| D-1173 (alpha-hydroxy-ketone) | Ciba Co. | Suitable for UV light source (wavelength between 300 nm-380 nm) |
| D-MBF (methylbenzoyl-formate) | Ciba Co. | Suitable for UV light source |
| I-2100 (phosphine oxide) | Ciba Co. | Suitable for UV light source |
| I-784 (metallocene) | Ciba Co. | Suitable for visible light source (wavelength between 500 nm-700 nm) |

The above initiators have structures represented as follows:

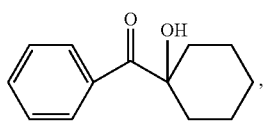

I-184

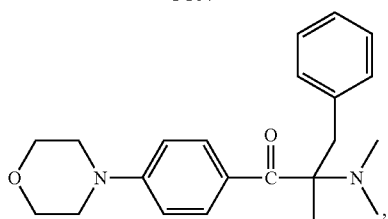

I-369

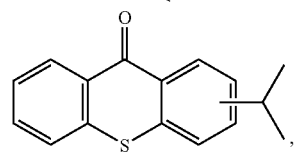

I-ITX

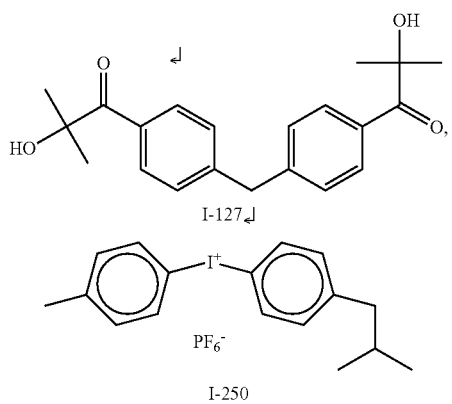

I-127

I-250

TABLE 3

Applied optical-electronic materials

| Optical-electronic materials | Source vendor | Descriptions/Remarks |
|---|---|---|
| NPB | Aldrich Co. | Hole transport material |
| Alq3 | Aldrich Co. | Light emitting material |
| PEDOT | Aldrich Co. | Hole transport material |
| P3HT | Aldrich Co. | P-type semiconductor material |
| PCBM | Aldrich Co. | N-type semiconductor material |

The above optical-electronic materials have structures represented as follows:

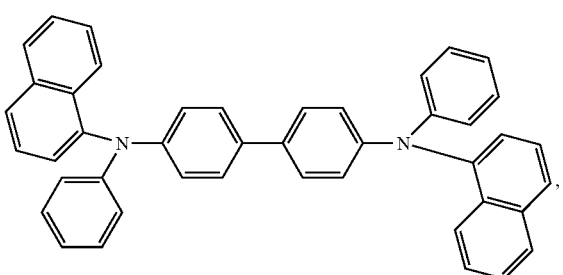

NPB

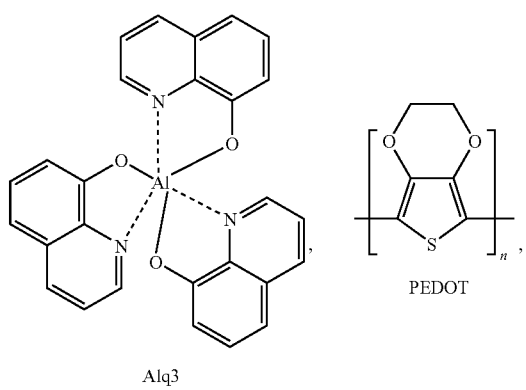

Alq3, PEDOT

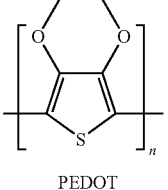

P3HT, PCBM

EXAMPLE 1

117 g benzyl methacrylate (BZMA), 86 g methyl methacrylate (MAA), 130 g 2-hydroxyl ethyl mathacrylate (2-HEMA), 39 g silica and 6 g initiator AIBN were mixed in a container. The above materials were then stirred by a mechanic agitator at a normal pressure and normal temperature such that an encapsulant composition was obtained. Next, a heating process was performed to polymerize the obtained encapsulant composition by a microwave source (about 800 W) for 10 minutes. Then turned off the microwave oven and added I-184 (6 g). After mechanically stirred for 30 min, acrylics copolymer I was obtained. The acrylic copolymer I was fabricated by synthesizing the encapsulant composition according to the following Formula (1):

Formula (1) is

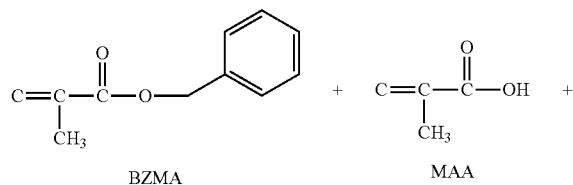

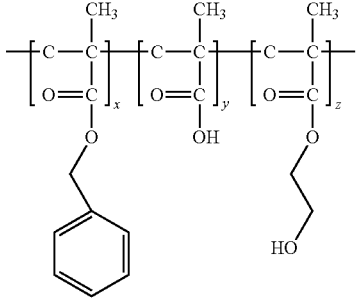

Acrylics I

Physical properties such as viscosity, molecular weight, adhesive strength, hardness, light transparency and reflective index of acrylic copolymer I were tested and results thereof are shown in Tables 5 and 6. Tests performed on the acrylic polymer I are described in Table 4, and measurements of adhesive strength, hardness, light transparency and reflective index were achieved by testing a substrate sample of 5 square centimeters coated over a substrate such as a glass substrate by the measuring instruments and measuring method described in Table 4. The substrate sample was previously cured by a DUV light illumination source for 3 minutes before tests were completed.

TABLE 4

Measuring instruments and methods for physical properties

| Physical property | Measuring instruments/Measuring methods |
| --- | --- |
| Viscosity | By Viscolite 700 (measuring temperature 25° C.) |
| Molecular weight | Waters Alliance GPC V2000 (Reference: Polystyrene; 25° C.) |
| Adhesive strength | By universal tester (obtained from Hung Ta Co.) (testing method: ASTM D1002) |
| Hardness | By pencil hardness tester ZSH 2090 (testing method: ASTM D-2240A) |
| Light transparency | HITACHI U-3300 (25° C.) |
| Reflective index | By Filmetrics F20 (25° C.) |

EXAMPLE 2

333 g PU-acrylics comonomer a, 39 g silica and 6 g initiator AIBN were mixed in a container. The above materials were then stirred by a mechanic agitator at a normal pressure and normal temperature such that an encapsulant composition was obtained. Next, a heating process was in-situ performed to polymerize the obtained encapsulant composition by a microwave source (about 800 W) for 10 minutes. Then turned off the microwave oven and added I-184 (6 g) and I-369 (4 g). After mechanically stirred for 30 min, PU-Acrylics I polymer were obtained. The PU-Acrylics I polymer was fabricated by synthesizing the encapsulant composition according to the following Formula (2):

Formula (2) is

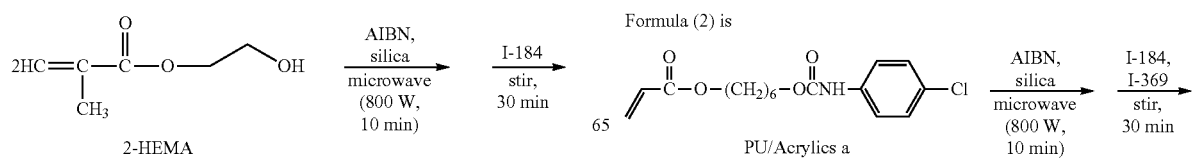

-continued

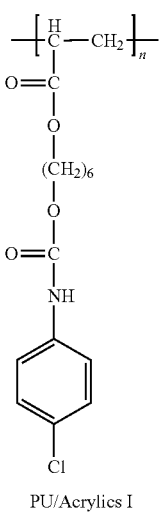
PU/Acrylics I

Physical properties of PU-acrylics polymer I of Example 2 were examined according to similar methods as described in Example 1 and results are shown in Tables 5 and 6.

EXAMPLE 3

333 g PU-acrylics comonomer b, 39 g silicon oxide and 6 g initiator AIBN were mixed in a container. The above materials were then stirred by a mechanic agitator at a normal pressure and normal temperature such that an encapsulant composition was obtained. Next, a heating process was in-situ performed to polymerize the obtained encapsulant composition by a microwave source (about 800 W) for 10 minutes. Then turned off the microwave oven and added I-184 (6 g) and I-369 (4 g). After mechanically stirred for 30 min, PU-Acrylics II polymer was obtained. The PU-Acrylics II polymer was fabricated by synthesizing the encapsulant composition according to the following Formula (3):

Formula (3) is

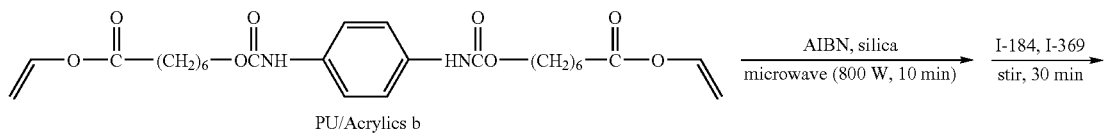
PU/Acrylics b

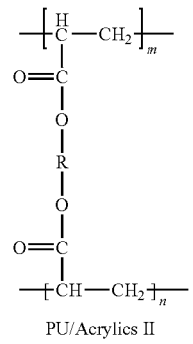
PU/Acrylics II

R: 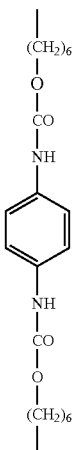

Physical properties of PU-acrylics polymer II of Example 3 were examined according to similar methods as described in Example 1 and results are shown in Tables 5 and 6.

EXAMPLE 4

333 g PU-acrylics comonomer c, 39 g silicon oxide and 6 g initiator AIBN were mixed in a container. The above materials were then stirred by a mechanic agitator at a normal pressure and normal temperature such that an encapsulant composition was obtained. Next, a heating process was in-situ performed to polymerize the obtained encapsulant composition by a microwave source (about 800 W) for 10 minutes. Then turned off the microwave oven and added I-184 (6 g) and I-369 (4 g). After mechanically stirred for 30 min, PU-Acrylics III polymer was obtained. The PU-Acrylics III polymer was fabricated by synthesizing the encapsulant composition according to the following Formula (4):

Physical properties of PU-acrylics polymer III of Example 4 were examined according to similar methods as described in Example 1 and results are shown in Tables 5 and 6.

EXAMPLE 5

333 g silicone monomer a, 39 g silicon oxide and 6 g initiator AIBN were mixed in a container. The above materials were then stirred by a mechanic agitator at a normal pressure and normal temperature such that an encapsulant composition was obtained. Next, a heating process was in-situ performed to polymerize the obtained encapsulant composition by a microwave source (about 800 W) for 10 minutes. Then turned off the microwave oven and added I-184 (3 g), I-369 (1.5 g) and I-ITX (1.5 g). After mechanically stirred for 30 min, silicone-acrylics polymer I was obtained. The silicone-acrylics polymer I was fabricated by synthesizing the encapsulant composition according to the following Formula (5):

Formula (4) is

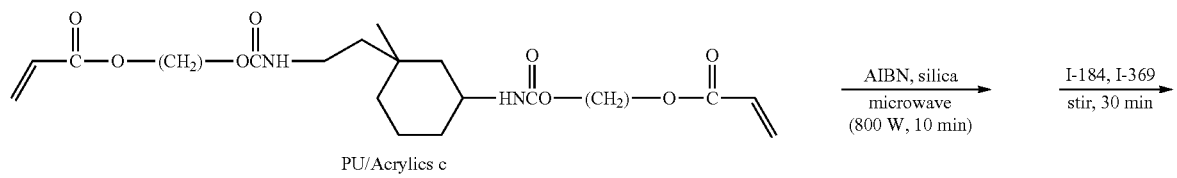

PU/Acrylics c

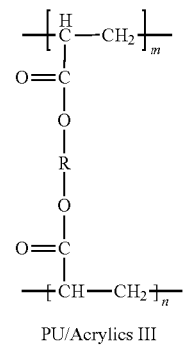

PU/Acrylics III

R:

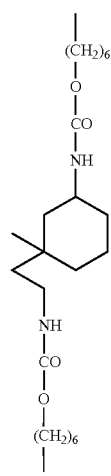

Formula (5) is

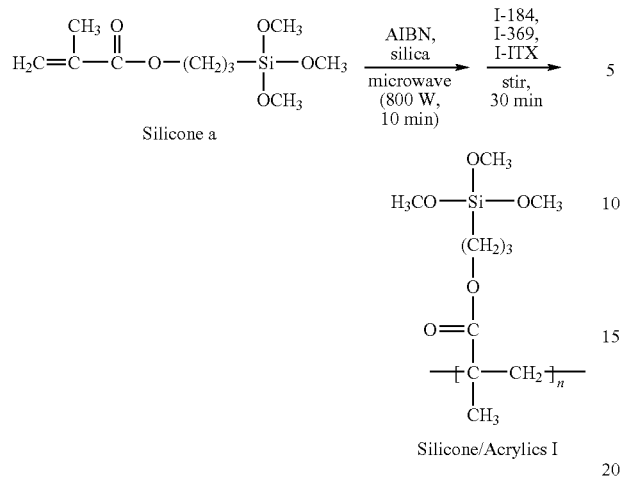

Silicone/Acrylics I

Physical properties of silicone-acrylics polymer I of Example 5 were measured according to similar methods as described in Example 1 and measuring results are shown in Tables 5 and 6.

EXAMPLE 6

166.5 g silicone monomer a, 166.5 g 2-HEMA, 39 g silicon oxide and 6 g initiator AIBN were mixed in a container. The above materials were then stirred by a mechanic agitator at a normal pressure and normal temperature such that an encapsulant composition was obtained. Next, a heating process was in-situ performed to polymerize the obtained encapsulant composition by a microwave source (about 800 W) for 10 minutes. Then turned off the microwave oven and added I-184 (3 g), I-369 (1.5 g) and I-ITX (1.5 g). After mechanically stirred for 30 min, silicone-acrylics copolymer II was obtained. The silicone-acrylics copolymer II was fabricated by synthesizing the encapsulant composition according to the following Formula (6):

Formula (6) is

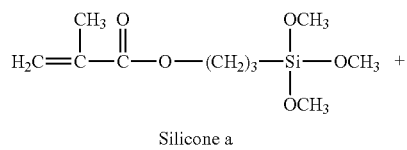

Silicone a

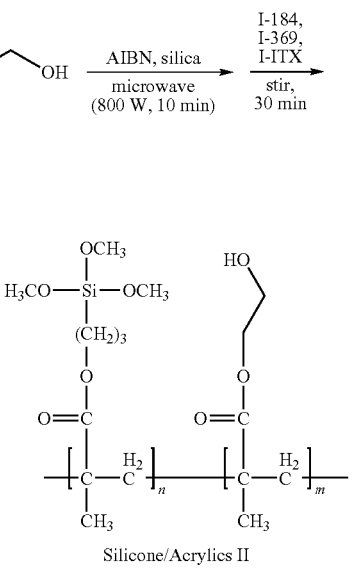

Silicone/Acrylics II

Physical properties of silicone-acrylics copolymer II of Example 6 were measured according to similar methods as described in Example 1 and measuring results are shown in Tables 5 and 6.

EXAMPLE 7

166.5 g silicone monomer a, 166.5 g PU-acrylics comonomer b, 39 g silicon oxide and 6 g initiator AIBN were mixed in a container. The above materials were then stirred by a mechanic agitator at a normal pressure and normal temperature such that an encapsulant composition was obtained. Next, a heating process was in-situ performed to illuminate the obtained encapsulant composition by a microwave source (about 800 W) for 10 minutes. Then turned off the microwave oven and added I-184 (2.7 g), I-369 (1.35 g), I-ITX (1.35 g) and I-127 (0.6 g). After mechanically stirred for 30 min, silicone-PU-acrylics copolymer I was obtained. The silicone-PU-acrylics copolymer I was fabricated by synthesizing the encapsulant composition according to the following Formula (7):

Formula (7) is

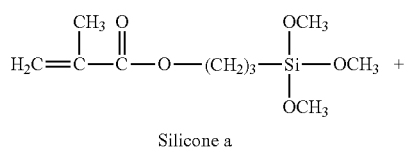

Silicone a

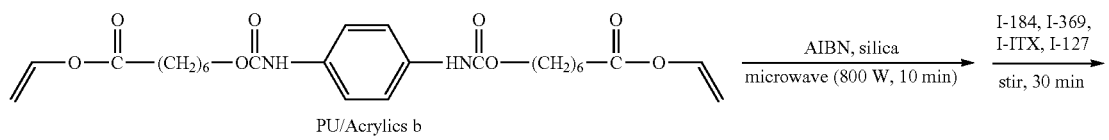

PU/Acrylics b

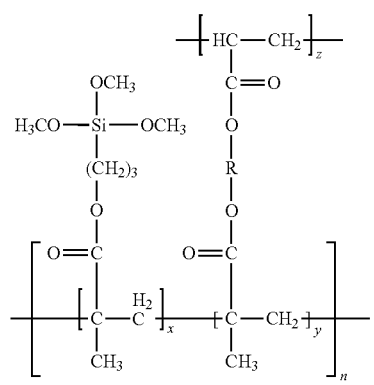

Silicone/PU/Acrylics I

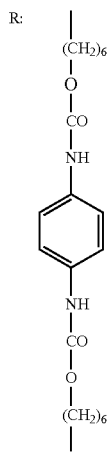

Physical properties of silicone-PU-acrylics copolymer I of Example 7 were measured according to similar methods as described in Example 1 and measuring results are shown in Tables 5 and 6.

EXAMPLE 8

333 g epoxy monomer a, 39 g silicon oxide and 6 g initiator 2-ethyl-4-methyl imidazole were mixed in a container. The above materials were then stirred by a mechanic agitator at a normal pressure and normal temperature such that an encapsulant composition was obtained. Next, a heating process was in-situ performed to polymerize the obtained encapsulant composition by a microwave source (about 800 W) for 10 minutes. Then turned off the microwave oven and added I-250 (6 g). After mechanically stirred for 30 min, epoxy polymer I was obtained. The epoxy polymer I was fabricated by synthesizing the encapsulant composition according to the following Formula (8):

Formula (8) is

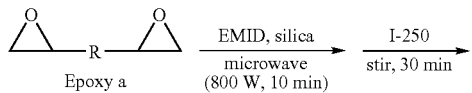

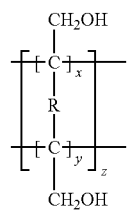

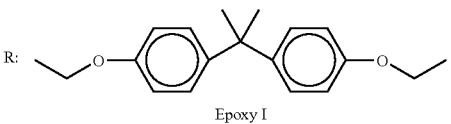

Epoxy I

Physical properties of epoxy polymer I of Example 8 were measured according to similar methods as described in Example 1 and measuring results are shown in Tables 5 and 6.

COMPARATIVE EXAMPLE 1

117 g benzyl methacrylate (BZMA), 86 g methyl Methacrylate (MAA), 130 g 2-hydroxyl ethyl mathacrylate (2-HEMA), 39 g silicon dioxide, 6 g initiator AIBN and 300 g propylene glycol monomethyl ether acetate (PGMEA), as a solvent, were mixed in a container. The above material was then stirred by a mechanic agitator at a normal pressure and normal temperature and was then heated up to 90° C. and maintained at this temperature for 6 hours. Then turned off the heater and added I-184 (6 g). After mechanically stirred for 30 min, acrylics copolymer I was obtained. Herein, the acrylic copolymer I was obtained by synthesizing the encapsulant composition according to the following Formula (9):

Formula (9) is

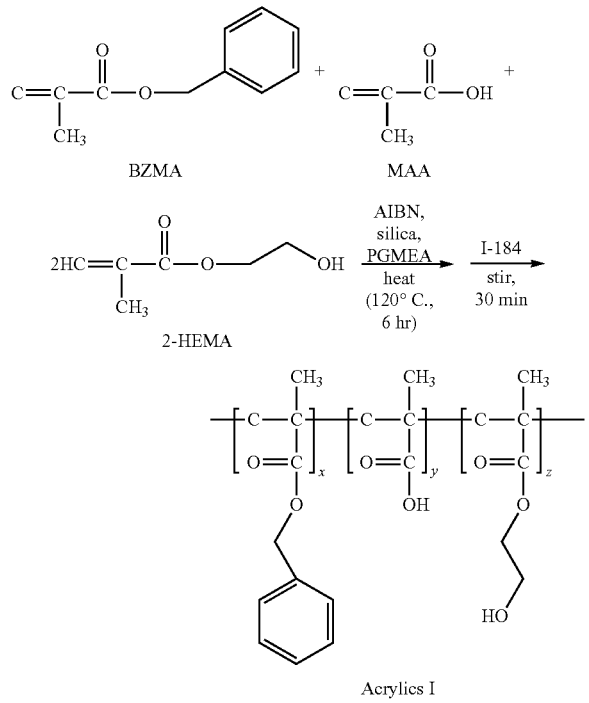

Acrylics I

Physical properties of the acrylic polymer I of Comparative Example 1 were measured according to similar methods as described in Example 1 and results are shown in Tables 5 and 6.

TABLE 5

Viscosity and molecular weight of encapsulant materials

| Encapsulant materials | Viscosity (cps) | Weight molecular ($M_w$) | Number-average molecular weight ($M_n$) | $M_w/M_n$ |
|---|---|---|---|---|
| Acrylic polymer I | 16,200 | 245,600 | 128,100 | 1.92 |
| PU-acrylics copolymer I | 9,300 | 138,600 | 74,900 | 1.86 |
| PU-acrylics copolymer II | 24,600 | 283,000 | 152,800 | 1.95 |
| PU-acrylics copolymer III | 23,900 | 276,000 | 133,100 | 2.07 |
| Silicone-acrylics copolymer I | 7,800 | 87,200 | 52,600 | 1.66 |
| Silicone-acrylics copolymer II | 9,500 | 115,700 | 63,900 | 1.81 |
| Silicone-PU-acrylics copolymer I | 13,800 | 127,400 | 79,200 | 1.61 |
| Epoxy polymer I | 12,800 | 115,200 | 61,600 | 1.87 |
| Acrylic copolymer of Comparative Example 1 | 8,100 | 112,300 | 55,800 | 2.01 |

TABLE 6

Physical properties of encapsulant materials

| Encapsulant materials | Adhesive strength (Kg/cm) | Hardness | Light transparency (%) | Reflective index (n) |
|---|---|---|---|---|
| Acrylic copolymer I | 0.36 | 2H | 91 | 1.38 |
| PU-acrylics copolymer I | 0.89 | 2H | 89 | 1.45 |
| PU-acrylics copolymer II | 1.53 | 3H | 92 | 1.46 |
| PU-acrylics copolymer III | 1.48 | H | 91 | 1.41 |
| Silicone-acrylics copolymer I | 1.78 | 3B | 95 | 1.62 |
| Silicone-acrylics copolymer II | 1.85 | 2B | 93 | 1.51 |
| Silicone-PU-acrylic polymer I | 2.27 | B | 92 | 1.58 |
| Epoxy copolymer I | 1.64 | 3H | 85 | 1.48 |
| Acrylic copolymer of Comparative Example 1 | 0.1 | H | 90 | 1.38 |

EXAMPLE 9

Referring to FIG. 1, a glass substrate 100 having an ITO layer 102 thereon was provided and immersed in a cleaning solution including acetone, methanol and DI water. The glass substrate 100 was cleaned by supersonic cleaning for 5 minutes and then treated by an $O_2$ plasma for 90 seconds. An electron transport layer 104 (NPB, having a thickness of about 50 nm), a light-emitting layer 106 (Alq3, having a thickness of about 50 nm), an electron injecting layer 108 (LiF, having a thickness of about 3 nm), and a cathode 110 (Al, having a thickness of about 80 nm) were sequentially formed over the ITO layer 102 by, for example, an evaporation method. Next, an encapsulant material of silicon-PU-acrylics copolymer obtained in Example 7 was coated (coating condition: stage I 1,500 rpm for 20 second, and stage II 3,500 rpm for 30 seconds) over the cathode layer 110 and encapsulated sidewalls of the above stacked layers. The encapsulant material was then cured with illumination from ultraviolet light for 10 seconds and thereby formed a package layer 170 on the top and sidewall surfaces, thus packaging an organic light emitting diode (OLED). Herein, the OLED emits light 180 such as green light toward a direction away from the glass substrate 100. Compared to a conventional OLED (having a decay time of 35 hours) packaged by an encapsulant material prepared using thermal processes, the OLED packaged by an encapsulant material prepared using microwave processes had a longer decay time of 95 hours, with an improved lifespan.

EXAMPLE 10

Figure 2:
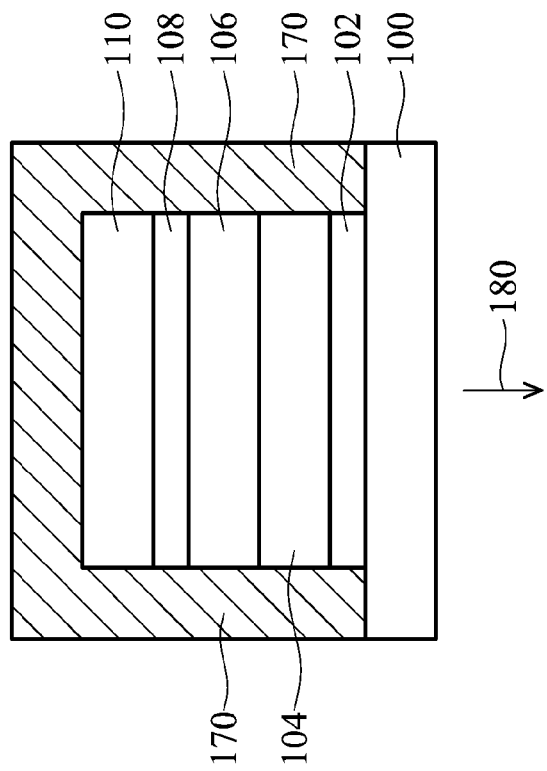
FIG. 2 is a schematic diagram showing a flexible light emitting diode according to an embodiment of the invention.
Figure 4:
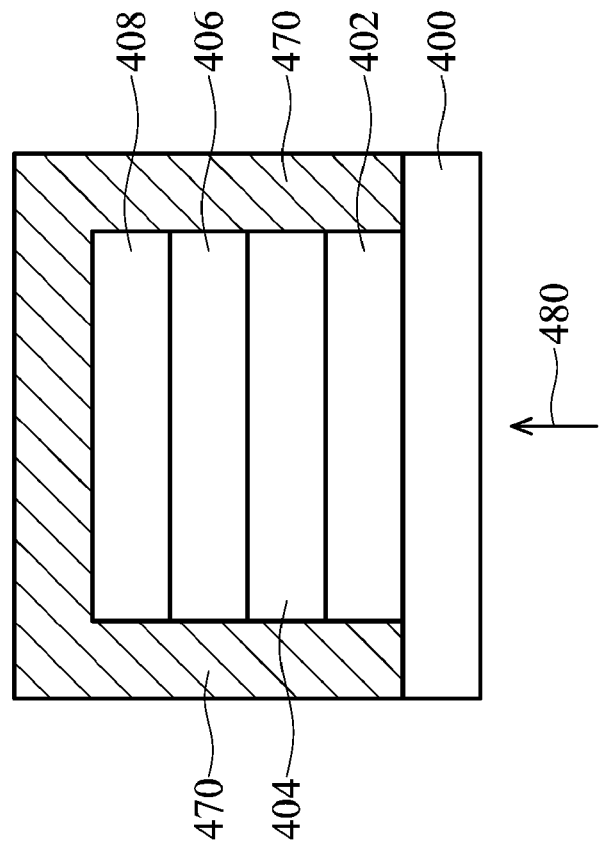
FIG. 4 is a schematic diagram showing an organic solar cell device according to an embodiment of the invention.

The fabrication steps in Example 9 are repeated and the glass substrate 100 was replaced by a polyethylene terephthalate (PET) substrate 200, thereby forming a packaged flexible OLED device. Herein, as shown in FIG. 2, components in the flexible OLED device were the same as the OLED device illustrated 100, except for the PET substrate 200. The components are referenced by the numerals illustrated in FIG. 1 and 100 here. Moreover, as shown in FIG. 2, the flexible OLED device emitted light 280 such as green light toward a direction away from the PET substrate 200. Compared to a conventional OLED (having a decay time of 14 hours) packaged by an encapsulant material prepared using thermal processes, the OLED packaged by an encapsulant material prepared using microwave processes had a longer decay time of 40 hours, with an improved lifespan.

EXAMPLE 11

Figure 3:
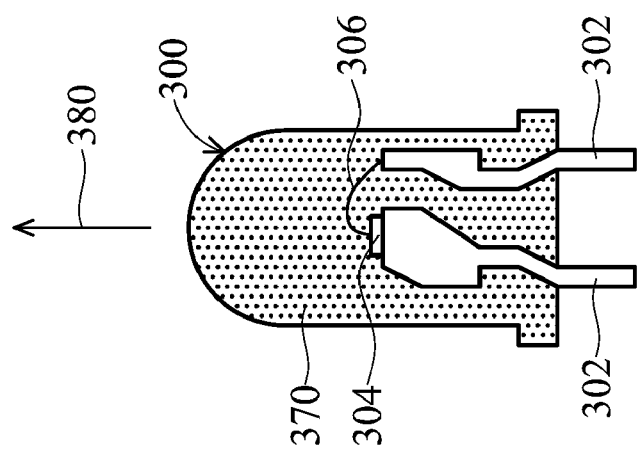
FIG. 3 is a schematic diagram showing a dome-shaped light emitting diode according to an embodiment of the invention.

Referring to FIG. 3, phosphors (produced by Nichia) were mixed with the silicon-PU-acrylics copolymer obtained in Example 7 in a ratio of 16:84 by weight. The mixed material was then filled in a portion of a frame 302 with a blue ray chip 304 (produced by Tekcore Co., Taiwan, having a thickness of 460 nm and formed with a surface of 15 mil square). The blue ray chip 304 was connected to another part of the frame 302 by wires 306. The above mixed material was then cured by illumination of UV light and the encapsulant material with blue ray chip 304 and phosphors therein were displaced in a light-transmitting dome-shaped shell 300. Next, an encapsulating layer 370 of the silicon-PU-acrylics copolymer was fully filled in the interior of the dome-shaped shell 300 and was cured by UV light for 5 minutes, thereby forming a dome-shaped light emitting device. In addition, the dome-shaped light emitting device emitted light 380 such as white light toward a direction away from the frame 302. Herein, the encapsulating layer 370 of silicon-PU-acrylics copolymer had a light transparency exceeding 85% after curing thereof without hindering, light emitting efficiency of the dome-shaped LED. Compared to a conventional dome-shaped LED (having a decay time of 17,000 hours) filled by an encapsulant material prepared using thermal processes, the dome-shaped LED filled by an encapsulant material prepared using microwave processes had a longer decay time of 36,000 hours, with an improved lifespan.

EXAMPLE 12

An ITO glass 400 was provided and immersed in a cleaning solution including acetone, methanol and DI water. The ITO glass 400 was cleaned by a supersonic cleaner for 5 minutes and then treated by an $O_2$ plasma for 90 seconds. An electron transport layer 402 (PEDOT) and an active layer 404 (P3HT/PCBM of a weight ratio of 1:1), were sequentially formed over the ITO glass 400 by, for example, spin coating. Coating conditions thereof were stage I 1,500 rpm for 20 second and stage II 3,500 rpm for 30 seconds for forming the hole transport layer 402, and stage I 1,000 rpm for 20 second and stage II 2,000 rpm for 30 seconds for forming the active layer 404. An electron injecting layer 406 (LiF) and a cathode 408 (Al) were sequentially formed over the active layer 404 by, for example, by an evaporation method. The silicone-PU-acrylics copolymer obtained in Example 7 was then coated over the cathode 408 and encapsulate thereof (coating condition: stage I 1,500 rpm for 20 second, and stage II 3,500 rpm for 30 seconds). The encapsulant material was then cured by illumination of ultraviolet light for 10 seconds and thereby formed an encapsulant layer 470 on the top and sidewall surfaces, thus forming a packaged solar cell. Herein, the solar cell received light 480 passing through the ITO glass 400. After 48 hours, compared to a conventional solar cell (having a decay ratio of 55%) packaged by an encapsulant material prepared using thermal processes, the solar cell packaged by an encapsulant material prepared using microwave processes had a lesser decay ratio of 14%, with an improved lifespan.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an encapsulant material, comprising:
   providing an encapsulant composition comprising at least one silane-containing monomer and at least one acrylic resin monomer, a filler and an initiator, wherein the filler is about 0.1-15 wt % of the encapsulant composition;
   performing a heating process by a microwave source to polymerize the encapsulant composition; and subsequently performing an illumination process
   by a light source to solidify the polymerized encapsulant composition.

2. The method for fabricating an encapsulant material as claimed in claim 1, wherein the heating process is performed for 1 to 200 minutes.

3. The method for fabricating an encapsulant material as claimed in claim 1, wherein the illumination process is performed for 1 to 200 minutes.

4. The method for fabricating an encapsulant material as claimed in claim 1, wherein the microwave source has a power of 1 to 20,000 watts.

5. The method for fabricating an encapsulant material as claimed in claim 1, wherein the light source has a power of 1 to 20,000 watts.

6. The method for fabricating an encapsulant material as claimed in claim 1, wherein the encapsulant material has a viscosity of 1-100,000 cps.

7. The method for fabricating an encapsulant material as claimed in claim 1, wherein the encapsulant material has a light transparency exceeding 85%.

8. The method for fabricating an encapsulant material as claimed in claim 1, wherein the acrylic resin monomer has a structure represented by a formula of:

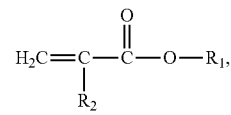

wherein each of $R_1$ and $R_2$ is an alkyl group having 1 to 12 carbon atoms, a tert-butyl group, an ester group having 1 to 12 carbon atoms, an alkoxy group having 1 to 12 carbon atoms or a cyclic ether group having 1 to 12 carbon atoms.

9. The method for fabricating an encapsulant material as claimed in claim 1, wherein the silane-containing monomer comprises a structure represented by a formula of:

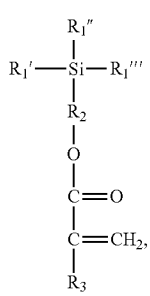

wherein $R_1'$, $R_1''$ and $R_1'''$ are the same or different, and each of $R_1'$, $R_1''$, $R_1'''$, $R_2$ and $R_3$ is an alkyl group having 1 to 12 carbon atoms, a tert-butyl group, an ester group having 1 to 12 carbon atoms, an alkoxy group having 1 to 12 carbon atoms or a cyclic ether group having 1 to 12 carbon atoms.

10. The method for fabricating an encapsulant material as claimed in claim 1, wherein the filler comprises metal oxides, metal halides or metal nitrides.

11. The method for fabricating an encapsulant material as claimed in claim 1, wherein the initiator comprises peroxides, azo compounds, free radical initiators, cationic initiators or metallocene complexes.

12. The method for fabricating an encapsulant material as claimed in claim 1, wherein the filler is 5-15 wt % of the encapsulant composition.

13. The method for fabricating an encapsulant material as claimed in claim 1, wherein the light source is an ultraviolet (UV) light source, a visible light source or an infrared (IR) light source.

14. A method of fabricating a light emitting device comprising encapsulating a light emitting device in an encapsulant material produced according to the method of claim 1.

15. A method of fabricating a light emitting device as claimed in claim 14 wherein the light emitting device is an organic light emitting diode or a light emitting diode.

16. A method of fabricating a solar cell comprising encapsulating a solar cell in an encapsulant material produced according to the method of claim 1.

* * * * *